United States Patent
Taguchi et al.

(10) Patent No.: US 6,878,921 B2
(45) Date of Patent: Apr. 12, 2005

(54) PHOTOVOLTAIC DEVICE AND MANUFACTURING METHOD THEREOF

(75) Inventors: Mikio Taguchi, Hirakata (JP); Toshio Asaumi, Kobe (JP); Akira Terakawa, Nara (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 43 days.

(21) Appl. No.: 10/305,262

(22) Filed: Nov. 27, 2002

(65) Prior Publication Data

US 2003/0168578 A1 Sep. 11, 2003

(30) Foreign Application Priority Data

Nov. 29, 2001 (JP) .......................................... 2001/365265
Feb. 28, 2002 (JP) .......................................... 2002/054767
Nov. 11, 2002 (JP) .......................................... 2002/327345

(51) Int. Cl.$^7$ ............................................. H01L 31/00
(52) U.S. Cl. ...................... 250/214.1; 257/458; 136/258
(58) Field of Search ........................... 250/214.1, 206, 250/214 R; 136/258, 249, 255, 261; 257/53, 55, 65, 2, 22, 80, 84, 371, 431, 458, 464; 327/509, 514, 573; 340/870.28, 870.29

(56) References Cited

U.S. PATENT DOCUMENTS 5,213,628 A 5/1993 Noguchi et al.
5,769,963 A * 6/1998 Fujioka et al. .............. 136/258

FOREIGN PATENT DOCUMENTS

JP 4-130671 5/1992

OTHER PUBLICATIONS

M. Isomura et al.; "Boron–compensation effect on hydrogenated amorphous silicon with oxygen and nitrogen impurities"; Applied Physics Letters; vol. 68, No. 9; Feb. 26, 1996; pp. 1201–1203./Discussed in the specification.

* cited by examiner

Primary Examiner—Thanh X. Luu
Assistant Examiner—Seung C. Sohn
(74) Attorney, Agent, or Firm—Armstrong, Kratz, Quintos, Hanson & Brooks, LLP

(57) ABSTRACT

A photovoltaic device having a crystalline semiconductor and an amorphous semiconductor thin film so that junction characteristics can be upgraded. The photovoltaic device includes an i-type amorphous silicon thin film and a p-type amorphous silicon thin layer laminated in this order on a front surface of an n-type single crystalline silicon substrate, and an i-type amorphous silicon layer and an n-type amorphous silicon layer laminated in this order on a rear surface of the single crystalline silicon substrate, wherein an i-type amorphous silicon film is formed after the front surface of the single crystalline silicon substrate is exposed to a plasma discharge using mixed gas of hydrogen gas and a gas containing boron so that atoms of boron may be interposed on an interface between the single crystalline silicon substrate and the i-type amorphous silicon layer.

7 Claims, 8 Drawing Sheets

US 6,878,921 B2

PHOTOVOLTAIC DEVICE AND MANUFACTURING METHOD THEREOF

BACKGROUND OF THE INVENTION

1. Field of the Invention

The present invention relates to a photovoltaic device utilizing a hetero semiconductor junction and a manufacturing method thereof.

2. Description of Related Art

A photovoltaic device is generally categorized into single crystalline-, polycrystalline-, and amorphous-based type depending on a type of a semiconductor of a part for converting absorbed light mainly into electric current. By the way, a hybrid type photovoltaic device taking both advantages of an amorphous semiconductor thin film and a crystalline semiconductor is studied (JP, H04-130671, A). In this photovoltaic device, an intrinsic amorphous silicon thin film without dopant of a conductive impurity or a substantially intrinsic amorphous silicon thin film doped with a small amount of an element in the 3A group of the periodic table such as boron is interposed on a junction interface in forming a semiconductor junction by combining a crystalline silicon semiconductor and an amorphous silicon semiconductor having different conductivities from each other so as to improve interface characteristics and photovoltaic conversion characteristics.

A p-n junction of this structure can be formed at a temperature lower than 200 degrees centigrade. Therefore, good interface characteristics can be achieved even with an impure substrate, which is subject to an adverse effect of impurity or deficiency of oxygen induction under a high temperature process.

A substantially intrinsic amorphous silicon thin film without dopant of a conductive impurity or a substantially intrinsic amorphous silicon thin film, and an amorphous silicon thin film made to be one conductive type or another conductive type by doping a one conductive type or another conductive type impurity are formed on a rear surface of the above-mentioned photovoltaic device to improve solar cell characteristics by BSF (Back Surface Field) effect.

FIG. 8 is a perspective view illustrating a photovoltaic device comprising a single crystalline silicon substrate with a textured surface, wherein a substantially intrinsic (i-type) amorphous semiconductor layer without dopant of a conductive impurity is interposed on a junction interface between the crystalline semiconductor and an amorphous semiconductor. As shown in the Fig., a front surface of an n-type single crystalline silicon (Si) substrate 101 is textured by alkaline etching or the like. An i-type amorphous silicon (a-Si) layer 102, a p-type amorphous silicon (a-Si) layer 103 and a transparent electrode 104 consisting of a transparent conductive film such as an ITO (Indium Tin Oxide) film are laminated in this order on the textured surface on a light receiving surface side of the single crystalline silicon substrate 101. Additionally, comb-shaped collector electrodes 105 consisting of silver (Ag), for example, are formed on the transparent electrode 104.

An i-type amorphous silicon (a-Si) layer 106, an n-type amorphous silicon (a-Si) layer 107 and a transparent electrode 108 consisting of a transparent conductive film such as an ITO (Indium Tin Oxide) film are laminated in this order on a rear surface of the single crystalline silicon substrate 101 to achieve a BSF effect. Additionally, comb-shaped collector electrodes 109 consisting of silver (Ag), for example are formed on the transparent electrode 108.

With the above structure, light reflection is suppressed on the textured surface so that light can be taken into the device effectively.

Meanwhile, the above-mentioned photovoltaic device can be formed under a low temperature process. Because of this low temperature process, it is difficult to remove water or organic matters on the surface of the substrate completely. Therefore, impurities such as oxygen, nitrogen or carbon exist on the surface of the substrate. The one most largely included among these impurities is oxygen having a density $1\times10^{20}$ cm$^{-3}$. Degraded interface characteristics caused by these impurities may adversely affect the p-n junction characteristics or BSF effect.

On the other hand, a method to achieve a substantially intrinsic amorphous silicon film by doping a small amount of boron is reported (Applied Physics Letters vol.68, 1996 p1201~p1203). According to this report, it is possible to compensate adverse effect of oxygen by introducing boron of density about $\frac{1}{1000}$ ($\sim 10^{17}$ cm$^{-3}$) into an amorphous silicon film containing oxygen of a certain density.

However, even if the aforementioned amount of boron is introduced to compensate an adverse effect of oxygen, it minimally affects solar cell characteristics. Improved interface characteristics should affect open circuit voltage mainly, but there is no change in open circuit voltage whether or not there is the compensation.

SUMMARY OF THE INVENTION

The present invention was made to solve the above-mentioned conventional problem and to improve interface characteristics between a crystalline semiconductor and an amorphous semiconductor thin film so that junction characteristics can be upgraded. In a semiconductor device according to the present invention, especially in a solar cell device, it is an object of the present invention to improve open circuit voltage.

A photovoltaic device according to the present invention comprises an intrinsic amorphous semiconductor thin film without dopant of a conductive impurity or a substantially intrinsic amorphous semiconductor thin film interposed on a one conductive type crystalline semiconductor to form a one conductive type or another conductive type amorphous semiconductor thin film, wherein a one conductive type or another conductive type impurity is provided in an interface formed from said crystalline semiconductor and said intrinsic amorphous semiconductor thin film without dopant of a conductive impurity or said substantially intrinsic amorphous semiconductor thin film.

The amorphous semiconductor thin film includes not only an amorphous semiconductor but also a microcrystalline semiconductor.

The crystalline semiconductor and the amorphous semiconductor thin film may be crystalline silicon and an amorphous silicon thin film, respectively. The one conductive type impurity may be an atomic element in the 5A group of the periodic table whose atomy surface density at the interface is in ranges between $1\times10^{11}$ cm$^{-2}$ and $5\times10^{14}$ cm$^{-2}$. The another conductive type impurity may be an atomic element in the 3A group of the periodic table whose atomy surface density at the interface is in a range between $1\times10^{11}$ cm$^{-2}$ and $5\times10^{13}$ cm$^{-2}$.

The crystalline semiconductor and the amorphous semiconductor thin film may be crystalline silicon and an amorphous silicon thin film, respectively. The one conductive type impurity may be an atomic element in the 3A group of the periodic table whose atomy surface density at the interface is in ranges between $1 \times 10^{11}$ cm$^{-2}$ and $5 \times 10^{13}$ cm$^{-2}$. The another conductive type impurity may be an atomic element in the 5A group of the periodic table, whose atomy surface density at the interface is in ranges between $1 \times 10^{11}$ cm$^{-2}$ and $5 \times 10^{13}$ cm$^{-2}$.

As described above, in a p-n junction formed from a crystalline semiconductor and an amorphous semiconductor thin film, junction characteristics may be improved by interposing an appropriate amount of one conductive type or other conductive type impurity in the vicinity of an interface between a substrate of a crystalline semiconductor and an amorphous semiconductor thin film to suppress recombination of carriers at the interface. Open circuit voltage can be improved in a solar cell using this junction.

Also in a BSF structure comprising the crystalline semiconductor and a substantially intrinsic amorphous semiconductor thin film, electron flow may be improved by interposing an appropriate amount of one conductive type or another conductive type impurity in the vicinity of an interface between a substrate of a crystalline semiconductor and an amorphous semiconductor thin film to moderate an effect of band offset, which leads to improvement of open circuit voltage.

A manufacturing method of the present invention comprises a process for cleaning a front surface of a one conductive type or an other conductive type crystalline semiconductor substrate by plasma discharge introducing a hydrogen gas and a gas containing a one conductive type or an other conductive type impurity, a process for forming an intrinsic amorphous semiconductor thin film without dopant of a conductive impurity or a substantially intrinsic amorphous semiconductor thin film on said front surface of the crystalline semiconductor substrate, and a process for forming an amorphous semiconductor thin film thereon, the amorphous semiconductor thin film made to be one conductive type or another conductive type by doping a one conductive type or another conductive type impurity.

Also another manufacturing method of a photovoltaic device according to the present invention comprises a process for forming a first amorphous semiconductor thin film by gas phase reaction introducing a gas containing a material to constitute an amorphous semiconductor thin film on a front surface of a crystalline semiconductor substrate and a gas containing a one conductive type or another conductive type impurity, a process for forming a substantially intrinsic second amorphous semiconductor thin film by gas phase reaction on the first amorphous semiconductor thin film, and a process for forming an amorphous semiconductor thin film on said second amorphous semiconductor thin film, the amorphous semiconductor thin film made to be one conductive type or another conductive type by doping a one conductive type or another conductive type impurity.

In addition, another manufacturing method according to the present invention comprises a process for exposing a one conductive type or another conductive type crystalline semiconductor substrate in a heated condition to a one conductive type or another conductive type impurity of low density as well as hydrogen gas, a process for forming an intrinsic amorphous semiconductor thin film without dopant of a conductive impurity or a substantially intrinsic amorphous semiconductor thin film on a front surface of said crystalline semiconductor substrate, and a process for forming an amorphous semiconductor thin film thereon, the amorphous semiconductor thin film made to be one conductive type or another conductive type by doping a one conductive type or another conductive type impurity.

By the above-described manufacturing method, a one conductive type or another conductive type impurity may be provided at an interface formed from the crystalline semiconductor and the intrinsic amorphous semiconductor thin film.

Figure 1A:
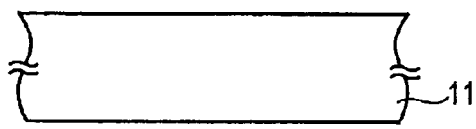
FIG. 1A to 1D are cross sectional views illustrating manufacturing processes of a photovoltaic device according to a first embodiment.

The foregoing and other objects, features, aspects and advantages of the present invention will become more apparent from the following detailed description of the present invention when reviewed in conjunction with the accompanying drawings.

DESCRIPTION OF THE PREFERRED EMBODIMENTS

Now explanations are made of embodiments according to the present invention by referring to the drawings.
(First embodiment)

FIG. 1A to 1D are cross sectional views illustrating manufacturing processes of a photovoltaic device according to the first embodiment.

A single crystalline silicon substrate or a polycrystalline silicon substrate may be used as a crystalline semiconductor substrate. In this embodiment, an n-type single crystalline substrate 11 of resistivity not more than 5 Ωcm and 300 μm in thickness is used. Both front and rear surfaces of this single crystalline silicon substrate 11 are textured by anisotropic etching using alkaline solution such as sodium hydroxide solution or potassium hydroxide solution.

The single crystalline silicon substrate 11 is cleaned and put into a vacuum chamber to be heated up to not more than 200 degrees centigrade so that water attached to the front surface of the substrate can be removed to the utmost. In this embodiment, the substrate is heated up to 170 degrees centigrade.

Next, hydrogen gas ($H_2$) is introduced and the substrate is exposed to plasma discharge to clean the surface thereof. It is known that this process is effective to reduce the amount of carbon on a surface of a substrate.

In this hydrogen plasma process of the first embodiment, diborane gas ($B_2H_6$) is introduced as well as hydrogen gas ($H_2$) to decompose and attach boron (B) onto the front surface so that boron is introduced into an interface of the single crystalline silicon substrate. Table 1 shows conditions for this process.

Figure 1B:
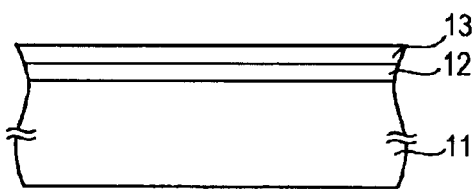

After that, silane gas ($SiH_4$) and diluting gas of hydrogen gas ($H_2$) are introduced and a non-doped i-type amorphous silicon layer 12 is formed by plasma CVD method while maintaining the substrate temperature 170 degrees centigrade. Then silane gas ($SiH_4$), diluting gas of hydrogen gas ($H_2$) and dopant gas of diborane gas ($B_2H_6$) are introduced and a p-type amorphous silicon layer 13 is formed sequentially by plasma CVD method to form a pn junction (FIG. 1B). Table 1 shows conditions for this process.

Figure 1C:
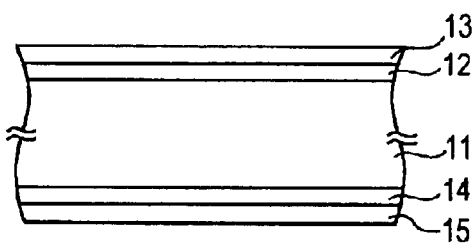

Next, a hydrogenated amorphous silicon thin film is formed on the rear surface of the above-mentioned n-type single crystalline silicon substrate 11 correspondingly. First, the n-type single crystalline silicon substrate 11 is put into a vacuum chamber to be heated up to not more than 200 degrees centigrade. In this embodiment, the substrate is heated up to 170 degrees centigrade. Next, hydrogen gas ($H_2$) is introduced and the substrate is exposed to plasma discharge. After that, silane gas ($SiH_4$) and diluting gas of hydrogen gas ($H_2$) are introduced and a non-doped i-type amorphous silicon layer 14 is formed by plasma CVD method while maintaining the substrate temperature at 170 degrees centigrade. Then silane gas ($SiH_4$), diluting gas of hydrogen gas ($H_2$) and dopant gas of phosphine gas ($PH_3$) are introduced and an n-type amorphous silicon layer 15 is formed sequentially by plasma CVD method to form a BSF structure on the rear surface of the n-type single crystalline silicon substrate 111 (FIG. 1C). Table 1 shows conditions for this process.

Figure 1D:
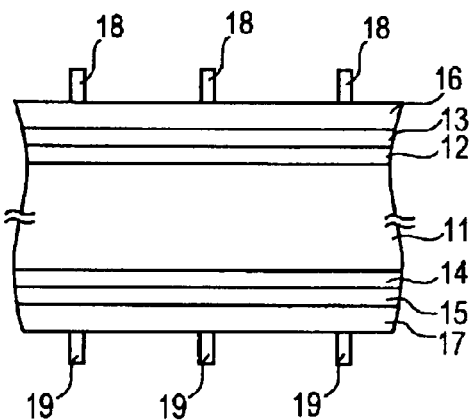

An indium tin oxide (ITO) layer 16 is formed by sputtering as a front surface side electrode and silver electrodes 18 are formed by a screen-printing method as collector electrodes. Also, an ITO layer 17 is formed by sputtering as a rear surface side electrode, and silver electrodes 19 are formed by a screen-printing method as collector electrodes, which completes the photovoltaic device (FIG. 1D).

In the above-described embodiment, the so-called BSF structure is formed on the rear surface side, but it may be omitted. When forming the BSF structure, the amorphous silicon layer may be formed from the front surface side (p-type side) as described above, or it may be formed from the rear surface side (n-type side) as well.

Detailed conditions for forming the above-mentioned photovoltaic device are shown in Table 1.

TABLE 1

| Process | | Substrate temperature °C. | Used gas | Pressure (Pa) | Power density (mW/cm$^2$) |
|---|---|---|---|---|---|
| Front surface side | Hydrogen process | 170 | $H_2$: 100 sccm $B_2H_6$: 0~100 sccm | 70 | 8.33 |
| | i-type a-Si | 170 | $SiH_4$: 40 sccm | 40 | 8.33 |
| | p-type a-Si | 170 | $H_2$: 0~100 sccm $SiH_4$: 40 sccm $B_2H_6$(2%): 40 sccm | 40 | 8.33 |
| Rear surface side | Hydrogen process | 170 | $H_2$: 100 sccm | 70 | 8.33 |
| | i-type a-Si | 170 | $SiH_4$: 40 sccm $H_2$: 0~100 sccm | 40 | 8.33 |
| | n-type a-Si | 170 | $SiH_4$: 40 sccm $PH_3$(1%): 40 sccm | 40 | 8.33 |

Figure 2:
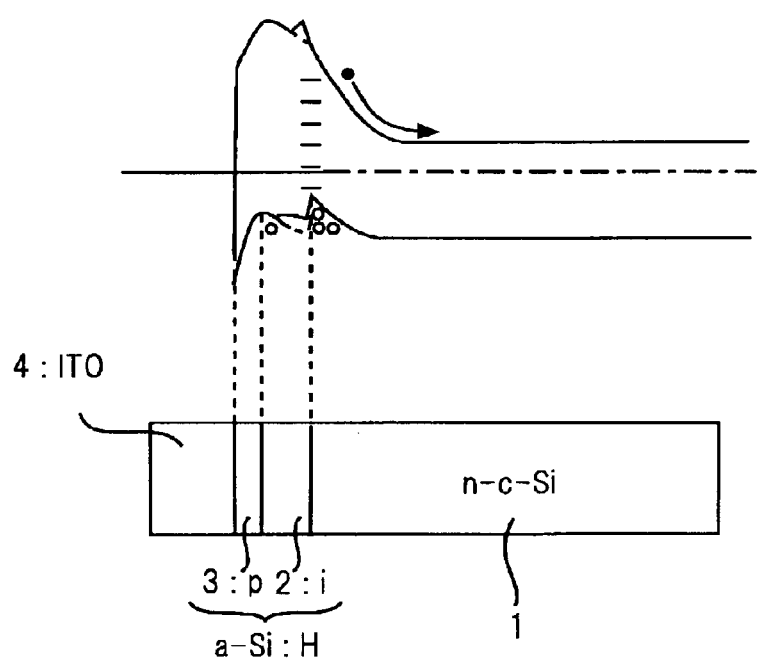
FIG. 2 is a band diagram of the photovoltaic device according to the first embodiment.

FIG. 2 is a band diagram of the photovoltaic device according to the present invention. In FIG. 2, full lines show a band diagram of the present invention, and dotted lines show a band diagram of a conventional method wherein no diborane gas is introduced in the hydrogen plasma process.

In the photovoltaic device formed by the above-described method, the substantially i-type amorphous silicon layer 12, the n-type amorphous silicon layer 13 and the ITO layer 16 are formed and laminated in this order on the n-type single crystalline silicon substrate 11. An excessive amount of boron to compensate the i-type amorphous silicon layer is introduced into the interface between the substrate 11 and the i-type amorphous silicon layer 12.

As shown in FIG. 2, an excessive amount of boron to compensate the amorphous layer introduced into the interface between the single crystalline silicon substrate 11 and the i-type amorphous silicon layer 12 makes the crystalline silicon layer 12 in the vicinity of the interface slightly p-type, and at the same time, a localized electric field intensity inside the single crystalline silicon substrate 11 in the vicinity of the interface becomes strong. Therefore, electrons and positive holes existing in the vicinity of the interface can be separated more effectively, resulting in a low probability of recombination at the interface. Also, carriers may transfer easily because a barrier of band discontinuity at the interface becomes relatively small. As a result, open circuit voltage in solar cell characteristics is improved.

The electric field intensity inside the i-type amorphous silicon layer becomes weak then, but it is still strong enough to allow easy transfer of carriers in the amorphous layer.

When too much boron is supplied, the electric field intensity inside the i-type amorphous silicon layer 12 becomes weak so that recombination of carriers in this part increases. Further supply of boron is approximately identical to a p-type amorphous silicon layer directly laminated on the n-type single crystalline silicon substrate, which leads to recombination through excessive boron, resulting in degraded solar cell characteristics.

A photovoltaic device according to the present invention is made under the conditions shown in Table 1. Output characteristics of this photovoltaic device are shown in Table 2. The above-mentioned photovoltaic device wherein no diborane gas is introduced in the hydrogen plasma process is used as a comparative example. In these samples, the BSF layers on the rear surface sides are formed at the same time.

TABLE 2

|  | Voc (V) | Isc (A) | F.F. | Pmax (W) |
|---|---|---|---|---|
| without introduction of $B_2H_6$ | 0.670 | 3.72 | 0.75 | 1.87 |
| with introduction of $B_2H_6$ | 0.692 | 3.70 | 0.76 | 1.95 |

As shown in Table 2, the open circuit voltage of the photovoltaic device wherein diborane gas is introduced in the hydrogen plasma process is improved, and the effectiveness of the present invention is confirmed.

Figure 3:
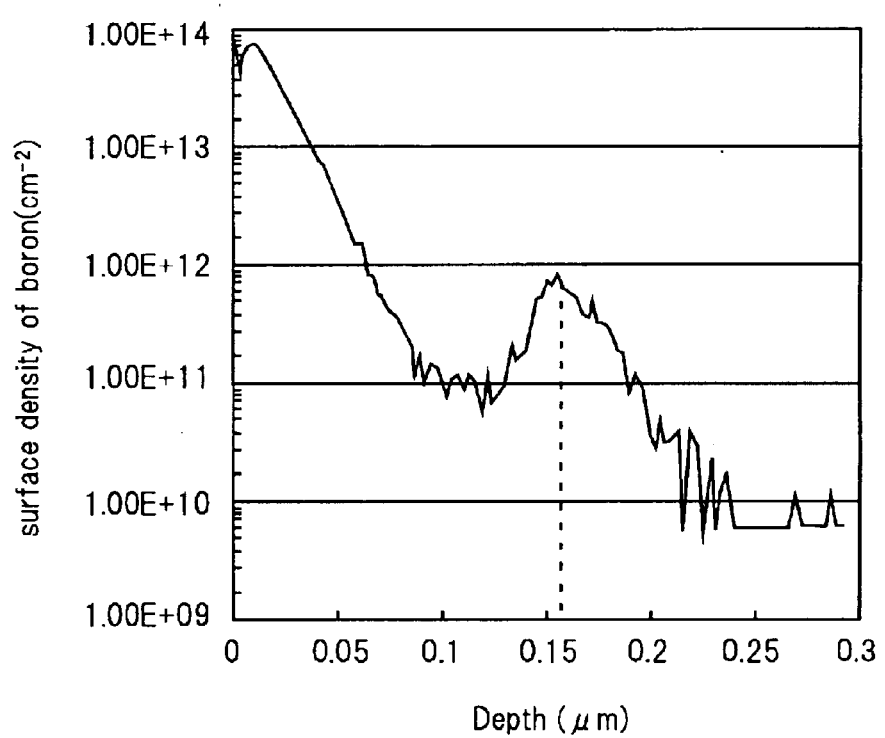
FIG. 3 is a pattern diagram showing impurity profiles in the depth direction when a thickness of a non-doped layer is 160 nm and that of a p-type layer is about 8 nm.

In the embodiment shown in Table 1, the thickness of the i-type amorphous silicon layer is about 7 nm and that of the p-type layer is about 5 mm. Because it is beyond the limit of resolution in the depth direction (10 nm to 20 nm) of existing secondary ion mass spectrometers, FIG. 3 shows impurity profiles in the depth direction when the thickness of the i-type amorphous silicon layer is 160 nm and that of the p-type layer is about 8 nm.

Atomy density of boron at the interface is obtained as follows. The value obtained by measuring the layers in the depth direction from the front amorphous silicon layer side by SIMS (secondary ion mass spectroscopy) analysis is integrated in the depth direction, which is voluminal density of boron. Then surface density at the interface is calculated from voluminal density in the vicinity of the interface in the depth direction (2 nm to 3 nm), which is called here atomy density of boron at the interface.

Dotted lines in the Fig. show locations of interfaces forming each layer, which is expected from profiles. The amount of boron existing at the substrate interface is about $6 \times 10^{11}$ cm$^{-2}$ by atomy density at the interface. The amount of boron in the intrinsic (i-type) amorphous silicon layer and the amount of boron inside the substrate are smaller than the amount of boron in the p-type amorphous silicon surface and the amount of boron at the interface of the substrate respectively and such declines are more moderate than the Gaussian distribution. Experience shows that this is because of implantation effect in sputtering during SIMS analysis.

Therefore, it seems that the density of boron is drastically lowered at each interface in reality, and little boron is diffused from the i-type amorphous silicon layer or the surface of the substrate into the substrate. It seems that if an actual solar cell is measured by a method with high degree of separation in the depth direction (1 nm to 2 nm) such as low voltage SIMS, the result will be accompanied by profiles analogous to that of boron (B) in FIG. 3.

(Second Embodiment)

Next, explanations are made of the second embodiment. A single crystalline silicon substrate is cleaned and put into a vacuum chamber to be heated up to not more than 200 degrees centigrade so that water attached to a front surface of the substrate can be removed to the utmost. In this embodiment, the substrate is heated up to 170 degrees centigrade.

Next, hydrogen gas (H) is introduced and the substrate is exposed to plasma discharge to clean the surface thereof. Then, hydrogen gas ($H_2$), diborane gas ($B_2H_6$), silane gas ($S_iH_4$) are introduced and the substrate is exposed to plasma discharge to laminate on the front surface of the substrate a first amorphous silicon layer ① of thickness about 1 μm doped with a slightly p-type impurity of low density so that boron is introduced in the vicinity of an interface. After that, a p-n junction is formed by laminating an i-type amorphous silicon layer ② and a p-type amorphous silicon layer in this order, as in the first embodiment. An indium tin oxide (ITO) layer is formed by sputtering as a front surface side electrode and silver electrodes are formed by screen-printing method as collector electrodes.

A photovoltaic device of the second embodiment according to the present invention is formed under conditions shown in Table 3.

TABLE 3

| | Conditions | | | |
|---|---|---|---|---|
| Process | Substrate temperature ° C. | Used gas | Pressure (Pa) | Power density (mW/cm$^2$) |
| Hydrogen process | 170 | $H_2$: 100 sccm | 70 | 8.33 |
| i-type a-Si ① | 170 | $H_2$: 0~100 sccm $SiH_4$: 40 sccm ($B_2H_6/SiH_4$: 10~2000 ppm) | 40 | 8.33 |
| i-type a-Si ② | 170 | $SiH_4$: 40 sccm | 40 | 8.33 |
| p-type a-Si | 170 | $H_2$: 0~100 sccm $SiH_4$: 40 sccm $B_2H_6$(2%): 40 sccm | 40 | 8.33 |

Figure 4:
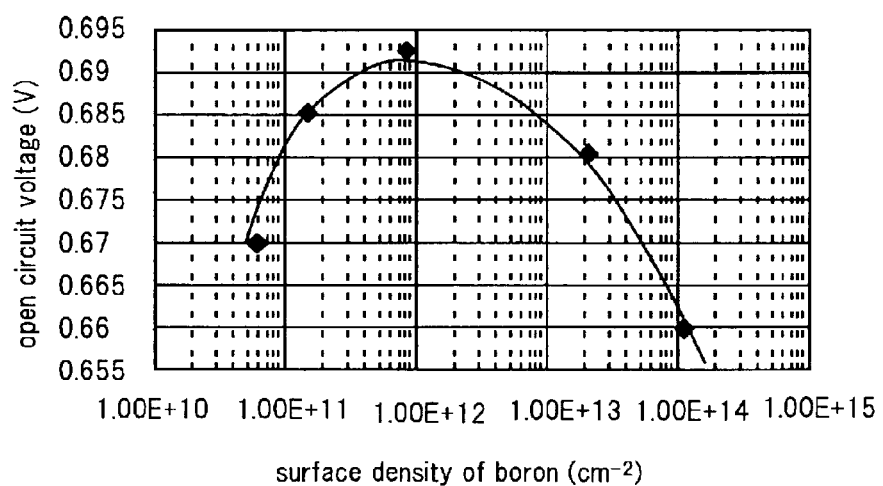
FIG. 4 is a characteristic chart of open circuit voltage according to changes in the amount of diborane introduced in a slightly p-type amorphous silicon layer doped with a small amount of diborane made in the vicinity of an interface between a substrate and an amorphous layer.

FIG. 4 is a characteristic chart of the open circuit voltage according to changes in amount of boron introduced in the slightly p-type amorphous silicon layer doped with diborane gas ($B_2H_6$) which is made in the vicinity of the interface between the substrate and the amorphous silicon layer formed under conditions shown in Table 3.

As can be seen in FIG. 4, the open circuit voltage increases in stages in comparison with an example without introducing diborane gas ($B_2H_6$). Open circuit voltage shifts to decrease as the amount of dopant further increases. Open circuit voltage can be improved in comparison with an example without introducing diborane when the introduced amount of boron is in ranges between $1 \times 10^{11}$ cm$^{-2}$ and $5 \times 10^{13}$ cm$^{-2}$ by atomy surface density. From FIG. 4, the amount of diborane gas ($B_2H_6$) should be so controlled that atomy surface density of boron introduced in the interface between the substrate and the amorphous silicon layer will be in ranges between $1 \times 10^{11}$ cm$^2$ and $5 \times 10^{13}$ cm$^2$.

(Third Embodiment)

Now explanations are made of the third embodiment. A single crystalline silicon substrate is cleaned and put into a vacuum chamber to be heated up to not more than 200 degrees centigrade so that water attached to a front surface of the substrate can be removed to the utmost. In this embodiment, the substrate is heated up to 170 degrees centigrade.

Next, hydrogen gas ($H_2$) is introduced and the substrate is exposed to plasma discharge to clean the surface thereof. Hydrogen gas ($H_2$) and diborane gas ($B_2H_6$) are introduced, and the substrate is exposed to said gases. Diborane gas ($B_2H_6$) is decomposed on and attaches to the heated surface of the substrate so that boron can be introduced in an interface. The substrate is exposed under the condition of substrate temperature of 170 degrees centigrade, density and flow rate of diborane gas ($B_2H_6$) 2% and 1000 sccm, respectively, pressure 40 Pa and treating time 1–600 seconds.

After that, a p-n junction is formed by laminating an i-type amorphous silicon layer and a p-type amorphous silicon layer in this order, as in the first embodiment. An indium tin oxide (ITO) layer is formed by sputtering as a front surface side electrode and silver electrodes are formed by screen-printing method as collector electrodes.

Similarly to the first embodiment, open circuit voltage is improved in this case, too. Differences in characteristics are mainly dependent on whether the device is made with or without an exposure process. Changes in exposure conditions do not have much effect.

As described above, in the p-n junction formed from crystalline silicon and the amorphous silicon semiconductor, junction characteristics may be improved by interposing an appropriate amount of boron in the vicinity of the interface between the crystalline silicon substrate and the amorphous silicon semiconductor thin film to suppress recombination of carriers at the interface. Open circuit voltage can be improved in a solar cell using this junction.

(Fourth Embodiment)

Above-mentioned first, second and third embodiments explain how to improve a p-n junction characteristics. The fourth embodiment is to improve BSF effect. Below explanations are made of the fourth embodiment by referring to the drawings.

FIG. 5A to 5D are cross sectional views illustrating manufacturing processes of a photovoltaic device according to the fourth embodiment.

A single crystalline silicon substrate or a polycrystalline silicon substrate can be used as a crystalline semiconductor substrate. In this fourth embodiment, an n-type single crystalline substrate 11 of resistivity not more than 5 Ωcm and 300 μm in thickness is used, as in the first embodiment. Both front and rear surfaces of this single crystalline silicon substrate 11 are textured by anisotropic etching using alkaline solution such as sodium hydroxide solution or potassium hydroxide solution.

Next, hydrogen gas ($H_2$) is introduced and the substrate is exposed to plasma discharge to clean the surface thereof.

In this hydrogen plasma process of this embodiment, phosphine gas ($PH_3$) is introduced as well as hydrogen gas to decompose and attach phosphorous (P) onto the rear surface so that phosphorous is introduced into an interface of a rear surface of the single crystalline silicon substrate 11. Table 4 shows conditions for this process.

Figure 5A:
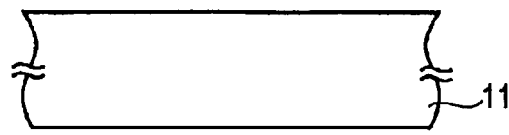
FIGS. 5A to 5D are cross sectional views illustrating manufacturing processes of a photovoltaic device according to a fourth embodiment.
Figure 5B:
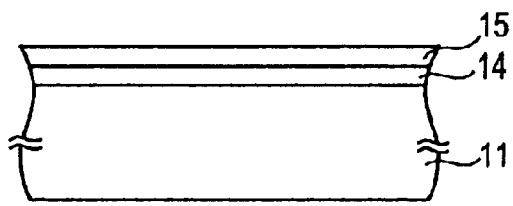

After that, silane gas ($SiH_4$) and diluting gas of hydrogen gas ($H_2$) are introduced and a non-doped i-type amorphous silicon layer 14 is formed by plasma CVD method while maintaining the substrate temperature 170 degrees centigrade. Then silane gas ($SiH_4$), diluting gas of hydrogen gas ($H_2$) and dopant gas of phosphine gas ($PH_3$) are introduced and an n-type amorphous silicon layer 15 is formed sequentially by plasma CVD method to form a BSF structure on the rear surface of the n-type single crystalline silicon substrate 11 (FIG. 5B). Table 1 shows conditions for forming this process.

Figure 5C:
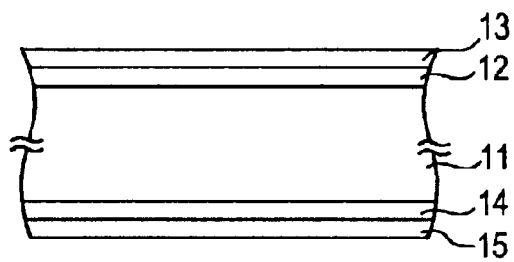

Next, a hydrogenated amorphous silicon thin film is formed on the rear surface of the above-mentioned n-type single crystalline silicon substrate 11 correspondingly. First, the n-type single crystalline silicon substrate 11 is put into a vacuum chamber to be heated to not more than 200 degrees centigrade. In this fourth embodiment, the substrate is heated to 170 degrees centigrade. Next, hydrogen gas ($H_1$) is introduced and the substrate is exposed to plasma discharge. After that, silane gas ($SiH_4$) and diluting gas of hydrogen gas ($H_2$) are introduced and a substantially i-type amorphous silicon layer 12 is formed by plasma CVD method while maintaining the substrate temperature 170 degrees centigrade. Then silane gas ($SiH_4$), diluting gas of hydrogen gas ($H_2$) and dopant gas of diborane gas ($B_2H_6$) are introduced and a p-type amorphous silicon layer 13 is formed sequentially by plasma CVD method to form a p-n junction (FIG. 5C). Table 4 shows conditions for forming this process.

Figure 5D:
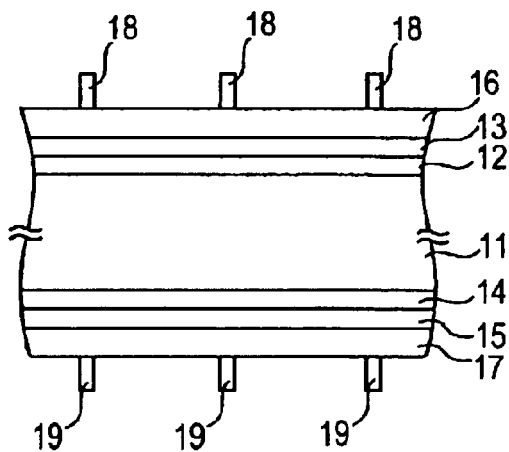

An indium tin oxide (ITO) layer 16 is formed by sputtering as a front surface side electrode and silver electrodes 18 are formed by screen-printing method as collector electrodes. Also, an ITO layer 17 is formed by sputtering as a rear surface side electrode, and silver electrodes 19 are formed by screen-printing method as collector electrodes, which completes the photovoltaic device (FIG. 5D).

Detailed conditions for forming the above-mentioned photovoltaic device are shown in

TABLE 4

| | | | Conditions | | |
|---|---|---|---|---|---|
| | Process | Substrate temperature °C. | Used gas (sccm) | Pressure (Pa) | Power density mW/cm² |
| Front surface side | Hydrogen process | 170 | $H_2$: 100 | 70 | 8.33 |
| | i-type a-Si | 170 | $SiH_4$: 40 | 40 | 8.33 |
| | p-type a-Si | 170 | $H_2$: 0~100 $SiH_4$: 40 $B_2H_6$(2%): 40 | 40 | 8.33 |
| Rear surface side | Hydrogen process | 170 | $H_2$: 100 $PH_3$(1%): 0~100 | 70 | 8.33 |
| | i-type a-Si | 170 | $SiH_4$: 40 | 40 | 8.33 |
| | n-type a-Si | 170 | $H_2$: 0~100 $SiH_4$: 40 $PH_3$(1%): 40 | 40 | 8.33 |

Figure 6:
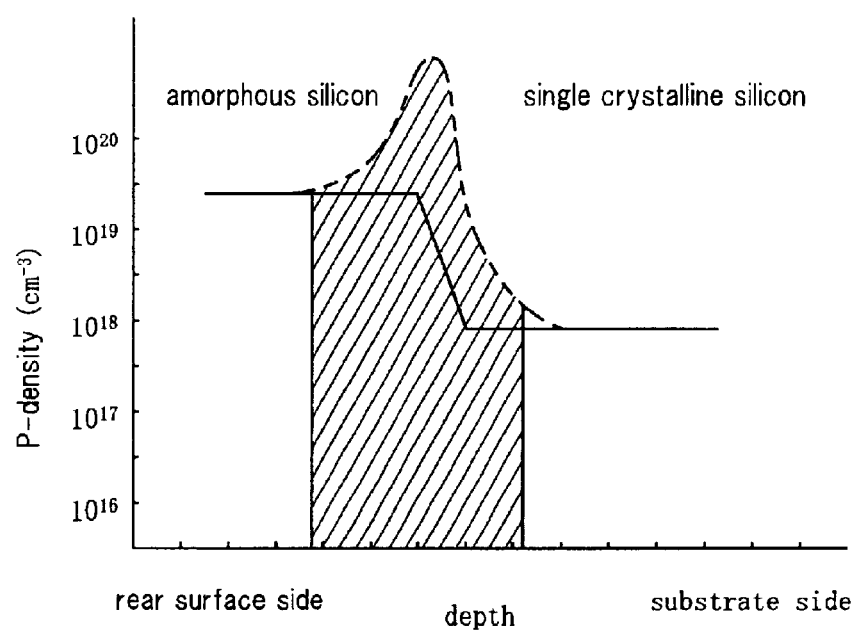
FIG. 6 is a characteristic chart illustrating p-density of the photovoltaic device according to the fourth embodiment analyzed by SIMS (secondary ion mass spectrometry).

Table 5 shows output characteristics according to changes in atomy density of phosphorous at the interface by varying flow rate of phosphine gas ($PH_3$) in the plasma process for the single crystalline silicon substrate 11 using mixed gas of hydrogen and phosphine ($PH_3$). Atomy density of phosphorous at the interface is obtained as follows. The value obtained by measuring the layers in the depth direction from the rear amorphous silicon layer side by SIMS (secondary ion mass spectroscopy) analysis is integrated in the depth direction, which is voluminal density of phosphorous (P). Then surface density at the interface is calculated from voluminal density in the vicinity of the interface in the depth direction (2 nm to 3 nm), which is referred to here as the atomy density of phosphorous at the interface. Then surface density at the interface is calculated from voluminal density in the vicinity of the interface in the depth direction (2 nm to 3 nm), which is corresponding to the hatched area in FIG. 6. The value obtained is referred to here as the atomy density of phosphorous at the interface.

TABLE 5

| | P-density (cm⁻²) | Voc (V) | Isc (A) | FF | Pmax (W) |
|---|---|---|---|---|---|
| without introduction of $PH_3$ | 9.20E+10 | 0.677 | 3.730 | 0.751 | 1.896 |
| with introduction of $PH_3$(a) | 5.00E+11 | 0.690 | 3.725 | 0.771 | 1.982 |
| with introduction of $PH_3$(b) | 7.00E+12 | 0.710 | 3.720 | 0.766 | 2.023 |
| with introduction of $PH_3$(c) | 2.00E+14 | 0.693 | 3.721 | 0.762 | 1.965 |
| with introduction of $PH_3$(d) | 5.00E+15 | 0.665 | 3.710 | 0.745 | 1.845 |

As can be seen in Table 5, open circuit voltage and fill factor (F.F.) are improved according to the fourth embodiment introducing phosphine gas ($PH_3$) into the plasma process for the rear surface of the single crystalline silicon substrate 11 in comparison with a comparative example without introducing phosphine gas ($PH_3$). This is because the effects of band offset have been moderated by introducing phosphorous into the interface, resulting in improvement of electron flow.

Figure 7:
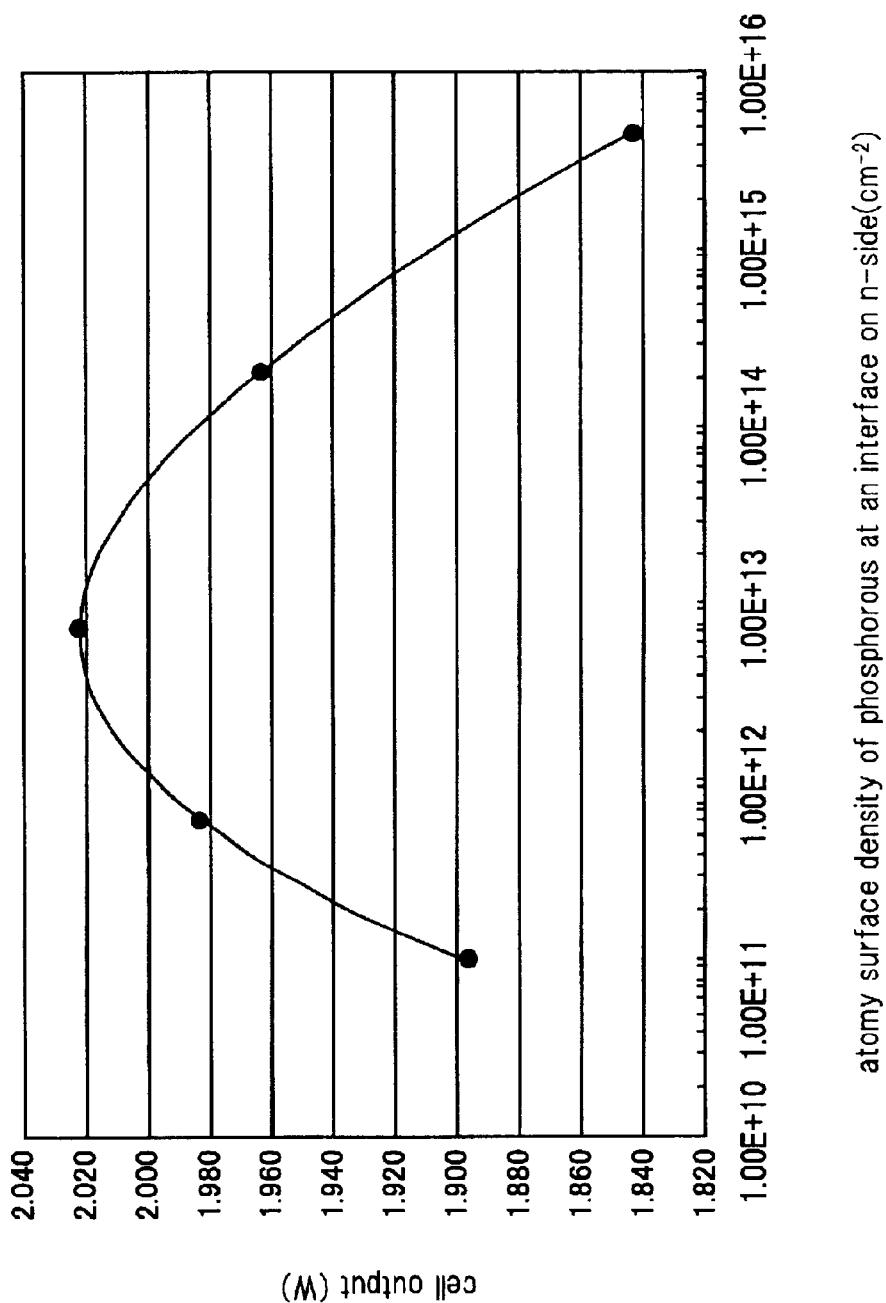
FIG. 7 is a characteristic chart illustrating a relation between an output (Pmax) of the photovoltaic device according to the fourth embodiment and the atomy density of phosphorous at an interface on a rear surface side.
Figure 8:
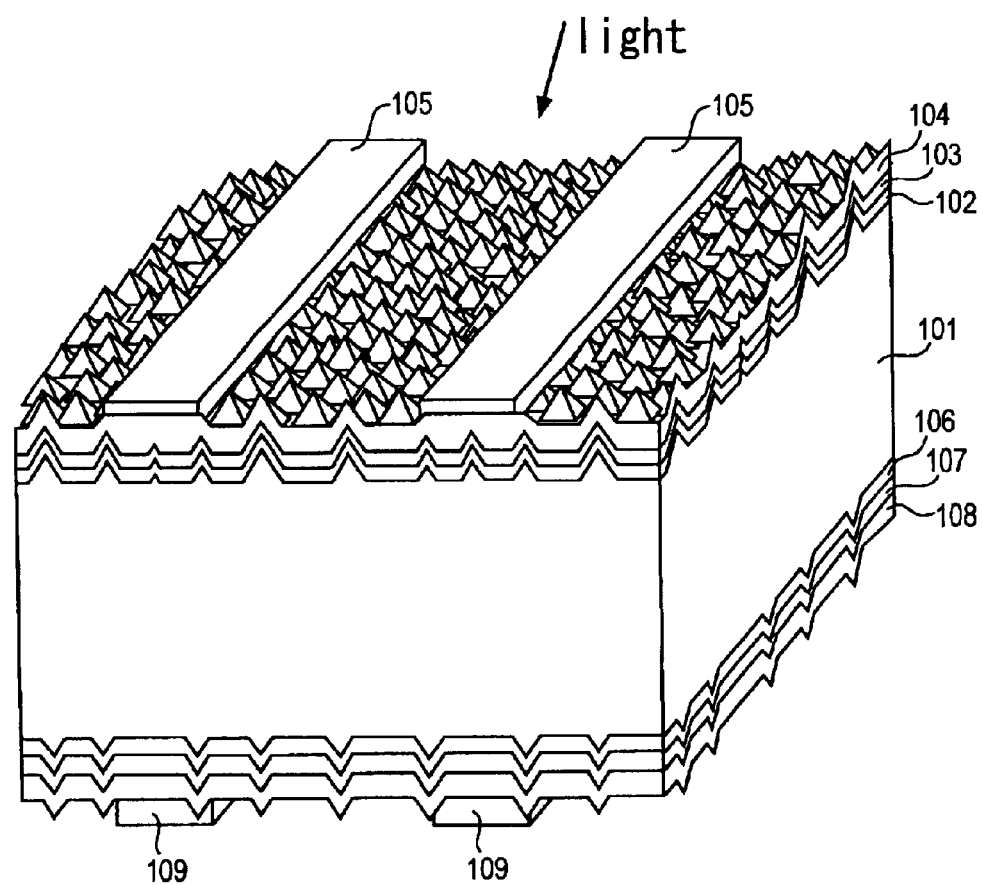
FIG. 8 is a perspective view illustrating a photovoltaic device wherein a surface of a single crystalline silicon substrate is textured and an i-type amorphous semiconductor layer is interposed on a junction interface between the crystalline semiconductor and an amorphous semiconductor.

FIG. 7 shows relations between cell output (Pmax) of the photovoltaic device wherein phosphine gas ($PH_3$) is introduced in the plasma process and atomy density of phosphorous at the rear surface side.

From FIG. 7, excellent cell output of over 1.900 W can be realized when atomy density of phosphorous at the interface is in ranges between $1\times10^{11}$ $cm^{-2}$ and $5\times10^{14}$ $cm^{-2}$. Therefore, the amount of phosphine gas ($PH_3$) introduced in the plasma process for the rear surface side of the single crystalline silicon substrate 11 should be so controlled that density of phosphorous at the interface will be in ranges between $1\times10^{11}$ $cm^{-2}$ and $5\times10^{14}$ $cm^{-2}$.

(Fifth Embodiment)

Next, descriptions are made of the fifth embodiment according to the present invention. An n-type single crystalline silicon substrate is cleaned and put into a vacuum chamber to be heated up to not more than 200 degrees centigrade so that water attached to a front surface of the substrate can be removed to the utmost. In this embodiment, the substrate is heated up to 170 degrees centigrade.

Next, hydrogen gas ($H_2$) is introduced and the substrate is exposed to plasma discharge to clean the surface thereof. Then, hydrogen gas ($H_2$), phosphine gas ($PH_3$) and silane gas ($SiH_4$) are introduced and the substrate is exposed to plasma discharge to laminate on the rear surface of the substrate a fourth amorphous silicon layer ④ of thickness about 1 nm doped with a slightly n-type impurity of low density so that phosphorous is introduced into the vicinity of an interface. After that, an i-type amorphous silicon layer ⑤ and an n-type amorphous silicon layer are formed sequentially to complete a BSF structure, as in the fourth embodiment. Also as in the fourth embodiment, an i-type amorphous silicon layer and a p-type amorphous silicon layer are formed subsequently on the front surface of the n-type single crystalline silicon substrate to form a p-n junction. Indium tin oxide (ITO) layers are formed by sputtering as a front surface side electrode and as a rear surface side electrode, and silver electrodes are formed by screen-printing method as collector electrodes.

A photovoltaic device of the fifth embodiment according to the present invention is formed under conditions shown in Table 6.

TABLE 6

| | | Conditions | | |
|---|---|---|---|---|
| Process | | Substrate Temperature °C. | Used Gas | Pressure (Pa) | Power density (mW/cm²) |
| Rear surface side | Hydrogen process | 170 | $H_2$: 100 sccm | 70 | 8.33 |
| | i-type a-Si ④ | 170 | $H_2$: 0~100 sccm $SiH_4$: 40 sccm ($PH_3/SiH_4$: 10~10000 ppm) | 40 | 8.33 |
| | i-type a-Si ⑤ | 170 | $SiH_4$: 40 sccm | 40 | 8.33 |
| | n-type a-Si | 170 | $H_2$: 0~100 sccm $SiH_4$: 40 sccm $PH_3$(1%): 40 sccm | 40 | 8.33 |

In this embodiment, as in the fourth embodiment, open circuit voltage is improved.

(Sixth Embodiment)

Next, descriptions are made for the sixth embodiment according to the present invention. An n-type single crystalline silicon substrate is cleaned and placed into a vacuum chamber to be heated to not more than 200 degrees centigrade so that water attached to a front surface of the substrate can be removed to the utmost. In this embodiment, the substrate is heated up to 170 degrees centigrade.

Next, hydrogen gas ($H_2$) is introduced and the substrate is exposed to plasma discharge to clean the surface thereof. Hydrogen gas ($H_2$) and phosphine gas ($PH_3$) are introduced, and the substrate is exposed to said gases. Phosphine gas ($PH_3$) is decomposed on and attaches to the heated surface of the substrate so that phosphorous can be introduced in an interface. The substrate is exposed under the condition of substrate temperature of 170 degrees centigrade, density and flow rate of phosphine gas ($PH_3$) 1% and 100 sccm, respectively, pressure 40 Pa and treating time 1–600 seconds.

After that, an i-type amorphous silicon layer and an n-type amorphous silicon layer are formed sequentially to complete a BSF structure, as in the fourth embodiment. Also as in the fourth embodiment, a substantially i-type amorphous silicon layer and a p-type amorphous silicon layer are formed subsequently on the front surface of the n-type single crystalline silicon substrate to form a p-n junction. Indium tin oxide (ITO) layers are formed by sputtering as a front surface side electrode and as a rear surface side electrode, and silver electrodes are formed by a screen-printing method as collector electrodes.

In this embodiment, as in the fourth embodiment, open circuit voltage is improved. Differences in characteristics are mainly dependent on whether the device is made with or without an exposure process. Changes in exposure conditions do not affect that much.

By the way, though an n-type substrate is used in each of the above-described embodiment, the present invention may also apply to a photovoltaic device comprising a p-type substrate wherein an i-type amorphous silicon layer, an n-type amorphous silicon layer, an ITO film and silver electrodes on the front surface side thereof, and an i-type amorphous silicon layer, a p-type amorphous silicon layer, an ITO film and silver electrodes on the rear surface side thereof. Also, the same result may be provided when the crystalline substrate is an n-type and p-type polycrystalline silicon substrate.

Although one conductive type or another conductive type impurity is introduced into an interface on either a front surface side or a rear surface side of the substrate in each of the above-described embodiment, such impurity may be introduced into interfaces on both the front and the rear surfaces side. For example, if the first and fourth embodiments are combined and impurities according to each of these two embodiments are introduced into interfaces on both the front and the rear surfaces of the substrate, advantages of said two embodiments would be combined, which may lead to further improvement of solar cell characteristics.

Although an amorphous silicon thin film is used as an amorphous semiconductor thin film in each of the above-described embodiment, a microcrystalline silicon thin film may be used as well. Although silicon is used as semiconductors in each of the above-described embodiment, the same result may be provided when germanium is used.

Additionally, though phosphorous is used as an atomic element in the 5A group of the periodic table in the above-described embodiments, other atomic elements in the 5A group of the periodic table such as arsenic (As), stibium (Sb) and so on may also provide the same effect. Although boron is used as an atomic element in the 3A group of the periodic table in the above-described embodiments, other atomic elements in the 3A group of the periodic table such as aluminum (Al) and so on may also provide the same effect.

As described above, in a p-n junction formed from a crystalline semiconductor and an amorphous semiconductor thin film, a junction interface may be improved by interposing an appropriate amount of one conductive type or another conductive type impurity in the vicinity of an interface between a substrate of a crystalline semiconductor and an amorphous semiconductor thin film to suppress recombination of carriers at the interface. Open circuit voltage can be improved in a solar cell using this junction. Also in a BSF structure comprising said crystalline semiconductor and a substantially intrinsic amorphous semiconductor thin film, electron flow may be improved by interposing an appropriate amount of one conductive type or other conductive type impurity in the vicinity of an interface between a substrate of a crystalline semiconductor and an amorphous semiconductor thin film to moderate effects of band offset, which leads to improvement of open circuit voltage.

Although the present invention has been described and illustrated in detail, it should be clearly understood that the description discloses examples of different embodiments of the invention and is not intended to be limited to the examples or illustrations provided. Any changes or modifications within the spirit and scope of the present invention are intended to be included, the invention being limited only by the terms of the appended claims.

What is claimed is:

1. A photovoltaic device, comprising:
   a one conductive type crystalline semiconductor;
   a one conductive type or another conductive type amorphous semiconductor thin film formed on the one conductive type crystalline semiconductor so as to form a p-n junction or a BSF (Back Surface Field) structure between the crystalline semiconductor and the amorphous semiconductor; and
   a substantially intrinsic amorphous semiconductor thin film without dopant of a conductive impurity interposed between the one conductive type crystalline semiconductor and the one conductive type or the other conductive type amorphous semiconductor thin film,
   wherein one conductive type or another conductive type impurity is provided at an interface formed with the one conductive type crystalline semiconductor and the substantially intrinsic amorphous semiconductor thin film without dopant of the conductive impurity.

2. The photovoltaic device according to claim 1, wherein said crystalline semiconductor and said amorphous semiconductor thin film are crystalline silicon and an amorphous silicon thin film, respectively, and
   said one conductive type impurity is an atomic element in the 5A group of the periodic table whose atomy surface density at the interface is in a range between $1\times10^{11}$ cm$^{-2}$ and $5\times10^{14}$ cm$^{-2}$.

3. The photovoltaic device according to claim 1, wherein said crystalline semiconductor and said amorphous semiconductor thin film are crystalline silicon and an amorphous silicon thin film, respectively, and
   said other conductive type impurity is an atomic element in the 3A group of the periodic table whose atomy surface density at the interface is in a range between $1\times10^{11}$ cm$^{-2}$ and $5\times10^{13}$ cm$^{-2}$.

4. The photovoltaic device according to claim 1, wherein said crystalline semiconductor and said amorphous semiconductor thin film are crystalline silicon and an amorphous silicon thin film, respectively,
   said one conductive type impurity is an atomic element in the 5A group of the periodic table whose atomy surface density at the interface is in a range between $1\times10^{11}$ cm$^{-2}$ and $5\times10^{14}$ cm$^{-2}$, and
   said other conductive type impurity is an atomic element in the 3A group of the periodic table whose atomy surface density at the interface is in a range between $1\times10^{11}$ cm$^{-2}$ and $5\times10^{13}$ cm$^{-2}$.

5. The photovoltaic device according to claim 1, wherein said crystalline semiconductor and said amorphous semiconductor thin film are crystalline silicon and an amorphous silicon thin film, respectively, and
   said one conductive type impurity is an atomic element in the 3A group of the periodic table whose atomy surface density at the interface is in a range between $1\times10^{11}$ cm$^{-2}$ and $5\times10^{13}$ cm$^{-2}$.

6. The photovoltaic device according to claim 1, wherein said crystalline semiconductor and said amorphous semiconductor thin film are crystalline silicon and an amorphous silicon thin film, respectively, and said other conductive type impurity is an atomic element in the 5A group of the periodic table whose atomy surface density at the interface is in a range between $1\times10^{11}$ cm$^{-2}$ and $5\times10^{14}$ cm$^{-2}$.

7. The photovoltaic device according to claim 1, wherein said crystalline semiconductor and said amorphous semiconductor thin film are crystalline silicon and an amorphous silicon thin film, respectively, said one conductive type impurity is an atomic element in the 3A group of the periodic table whose atomy surface density at the interface is in ranges a range between $1\times10^{11}$ cm$^{-2}$ and $5\times10^{13}$ cm$^{-2}$, and
   said other conductive type impurity is an atomic element in the 5A group of the periodic table whose atomy surface density at the interface is in a range between $1\times10^{11}$ cm$^{-2}$ and $5\times10^{14}$ cm$^{-2}$.

* * * * *